United States Patent
Faist et al.

(10) Patent No.: US 6,751,244 B2
(45) Date of Patent: Jun. 15, 2004

(54) QUANTUM CASCADE LASER WITH OPTICAL PHONON EXCITATION

(75) Inventors: Jérôme Faist, Saint-Blaise (CH); Mattias Beck, Basel (CH); Antoine Muller, Neuchâtel (CH)

(73) Assignee: Alpes Lasers S.A., Neuchatel (CH)

( * ) Notice: Subject to any disclaimer, the term of this patent is extended or adjusted under 35 U.S.C. 154(b) by 0 days.

(21) Appl. No.: 10/363,190

(22) PCT Filed: Sep. 10, 2001

(86) PCT No.: PCT/CH01/00543

§ 371 (c)(1),
(2), (4) Date: Mar. 4, 2003

(87) PCT Pub. No.: WO02/23686

PCT Pub. Date: Mar. 21, 2002

(65) Prior Publication Data

US 2003/0174751 A1 Sep. 18, 2003

(30) Foreign Application Priority Data

Sep. 13, 2000 (EP) ............................. 00810823

(51) Int. Cl.$^7$ ................................. H01S 5/323
(52) U.S. Cl. ........................................ 372/45
(58) Field of Search ............................ 372/45

(56) References Cited

U.S. PATENT DOCUMENTS 5,457,709 A * 10/1995 Capasso et al. ............... 372/45
6,137,817 A   10/2000 Baillargeon et al. ......... 372/45

FOREIGN PATENT DOCUMENTS

| EP | 0 964 488 A2 | * 12/1999 | ............. H01S/3/18 |
|----|--------------|-----------|------------------------|
| WO | WO 00/35060  | 6/2000    | ............. H01S/5/34 |
| WO | WO 00/59085  | 10/2000   | ............. H01S/5/34 |

OTHER PUBLICATIONS

Faist, Jerome et al, "Distributed feedback quantum cascade lasers", Appl. Phys. Lett. 70 (20), May 19, 1997 pp. 2670–2672.*
Faist, Jerome et al, "Short wavelength (λ~3.4 μm) quantum cascade laser based on strained copensated InGaAs/AllnAs", Applied Physics Letters vol. 72, No. 6, Feb. 1998.*
Li, Y.B. et al, "Intersubband electroluminescence in GaAs/AlGaAs quantum cascade structures", Electronics Letters $23^{rd}$ Oct. 1997, vol. 33 No. 22, pp. 1874–1875.*
Campman et al. "Interface roughness and alloy–disorder scattering contributions to intersubband transition linewidths" *Appl. Phys. Letters* 69:17:2554–2556; Oct. 21, 1996.
Faist et al. "Short wavelength (λ~3.4μm) quantum cascade laser based on strained compensated InGaAs/AllnAs" *Appl. Phys. Letters* 72: 6:680–682; Feb. 9, 1998.
Muller et al. "Electrically tunable, room temperature quantum–cascade lasers" *Appl. Phys. Letters* 75:11:1509–1511; Sep. 13, 1999.

* cited by examiner

*Primary Examiner*—James W. Davie
(74) *Attorney, Agent, or Firm*—Van Tassel & Associates

(57) ABSTRACT

A quantum cascade laser comprising two electrodes (10, 18) for applying an electric control field and a waveguide placed between the two electrodes and which comprises:

a gain region (14) consisting of several layers (20) which each comprise alternating strata (22) of a first type each defining a quantum barrier and strata (24) of a second type each defining a quantum well, and two optical confinement layers (12, 16) placed on each side of the gain region (14).

According to the invention, each layer (20) of the gain region (14) is arranged so that the active region has three subbands, the potential differences between them being such that the transition of an electron between the two furthermost emits an energy ($E_{GH}$, $E_{HI}$) corresponding to that needed for the emission of two optical phonons.

21 Claims, 3 Drawing Sheets

QUANTUM CASCADE LASER WITH OPTICAL PHONON EXCITATION

FIELD OF THE INVENTION

The present invention relates to quantum cascade lasers. More particularly, it relates to lasers comprising two electrodes for applying an electric control filed and a waveguide placed between the two electrodes and which comprises:

a gain region consisting of several layers which each comprise alternating strata of a first type each defining a quantum barrier and strata of a second type each defining a quantum well, these strata consisting of first and second semiconductor materials, respectively forming barriers and wells, and two optical confinement layers placed on each side of the gain region.

In the present document, the term "stratum" refers to a thin layer having a degree of uniformity in its composition, and "layer" to a set of strata having one and the same function.

BACKGROUND OF THE INVENTION

A laser of this type is described in patent U.S. Pat. No. 5,457,709. It consists of strata of first and second types, which respectively form barriers and quantum wells. The materials forming the barriers and wells are chosen so that they have a lattice parameter substantially equal to that of the substrate, so as to preserve the single crystal structure throughout the thickness of the laser.

The difference in crystal potential of the first and second materials respectively constituting the strata of the first and second types defines, by quantum effect, one or more two-dimensional states called subbands.

Each of the layers has an active region and an energy relaxation region. The application of an electric field to the terminals of the electrodes generates a current of charge carriers, especially inside the gain region.

The emission of laser radiation is generated by the transition of charge carriers in the active region from a first to a second subband. In general, these charge carriers are electrons. This phenomenon, called intersubband transition, is accompanied by the emission of a photon.

More specifically, the wells of the active zone comprise at least three subbands, respectively called upper, middle and lower subbands. Photons are emitted during a transition between the upper and middle subbands. This transition is made possible since the population of the middle subband is reduced by transfer of its electrons toward the lower subband, with emission of an optical phonon. For this to be possible, it is necessary that the energy lost by a charge carrier passing from the middle subband to the lower subband is larger than or equal to that of the optical phonons specific to the material used.

SUMMARY OF THE INVENTION

The main aim of the present invention is to improve this type of laser. To this end, each layer of the gain region has an injection barrier and an active region consisting of at least three pairs of strata, each pair consisting of a stratum of the first type and a stratum of the second type. The strata of the active region of each layer are arranged so that each of the wells has at least a first upper subband, a second middle subbands, and third and fourth lower subbands, the potential difference between the second and third subbands, on the one hand, and the third and fourth subbands, on the other hand, being such that the transition of an electron from the second to the third subbands, or from the third to the fourth, emits an energy said to be corresponding to that needed for the emission of an optical phonon of the single crystal in question.

Advantageously, the laser according to the invention comprises at least four strata of the second type.

In such lasers, the first and second materials, respectively forming barriers and wells, are deposited successively, while checking that the latter are pure or suitably doped, each stratum having a uniform composition, except for a few atomic layers adjoining the neighboring strata. By proceeding in this way, a succession of wells and barriers having almost vertical sides is obtained. Now, it has been noticed that the electrons tend to diffuse at the interfaces of these strata.

More specifically, the study carried out by K. L. Campman et al., and published under the title "Interface roughness and alloy-disorder scattering contributions to intersubband transition linewidths" in Appl. Phys. Letters 69 (17), Oct. 21, 1996, has shown that the interfaces of the strata have a determining effect on the enlargement of the intersubband transition, which generates an increase in the threshold current.

In order to reduce this current, and in a particularly beneficial embodiment, the strata of the first and of the second type respectively have concentrations of 100% of the first and of the second materials in their middle parts, while between two middle parts, the strata consist of an alloy of the two materials, the concentration of which varies continuously.

Generally, the laser comprises a substrate, made of indium phosphide (InP), on which the various layers are placed.

With an InP substrate, it is advantageous for the second material to be InGaAs and the first to be chosen from AlGaAs, InP and AlInAs.

Depending on the applications, the wavelength of the laser radiation must be relatively short. A study carried out by J. Faist et al., entitled "Short wavelength quantum cascade laser based on strained compensated InGaAs/AlInAs" and published in Appl. Phys. Letters vol. 72, No. 6 of Feb. 9, 1998, has shown that it is possible to increase the difference in crystal potential of the two materials forming the strata and, consequently, to reduce the wavelength of the photons emitted. It is for this reason, advantageously, that the first and second materials are chosen such that they have lattice parameters one of which is greater, the other of which is smaller than those of the substrate.

In some applications, it is necessary to have radiation exhibiting a narrow emission spectrum. To this end, the confinement layer opposite the substrate has a structure defining a diffraction grating having a pitch equal to a multiple of a half wavelength in the crystal with the desired emission spectrum.

BRIEF DESCRIPTION OF THE DRAWINGS

Other advantages and features of the invention will emerge from the following description, made with regard to the appended drawings, in which.

DETAILED DESCRIPTION OF THE PREFERRED EMBODIMENTS

Figure 1:
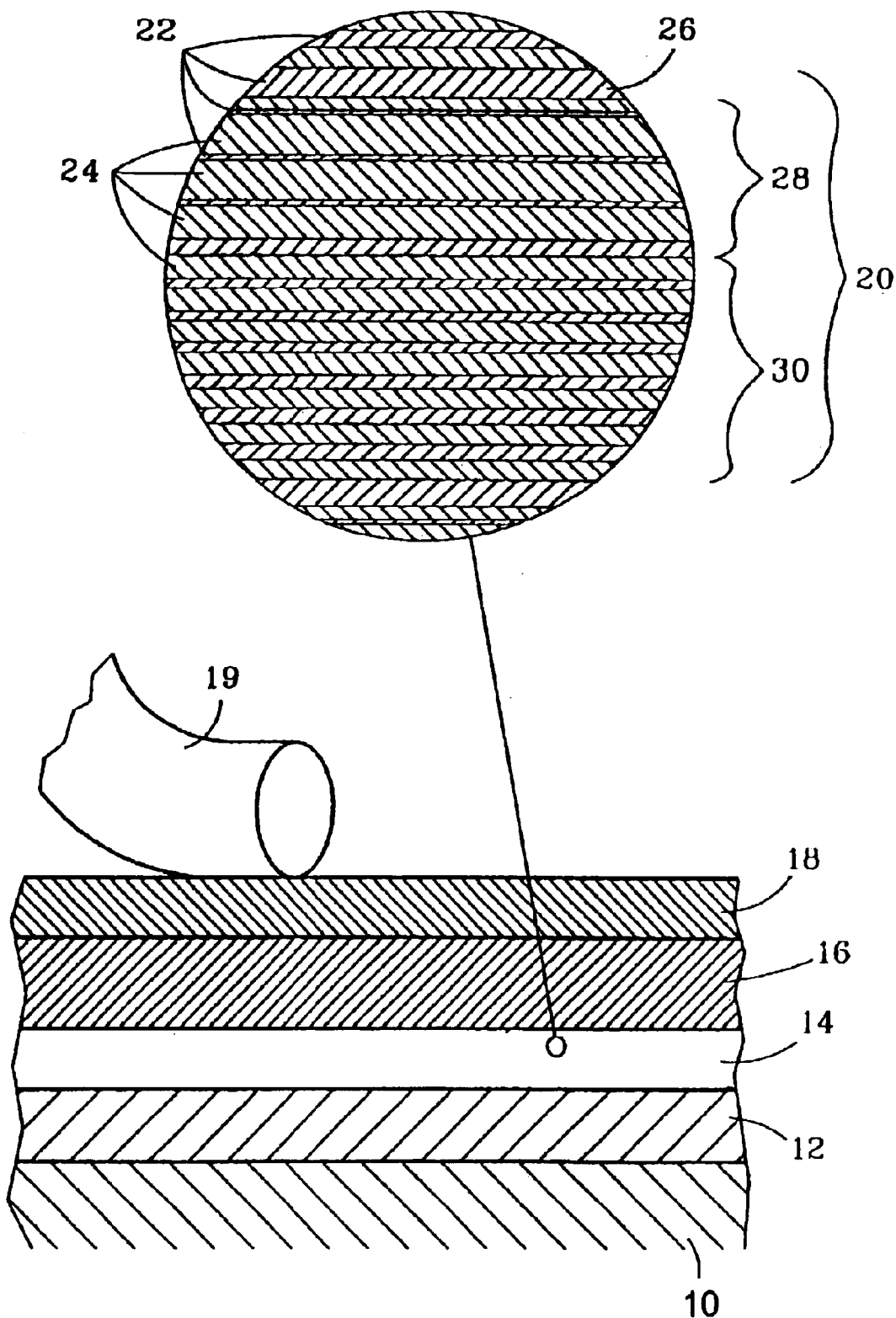
FIG. 1 shows schematically the structure of a laser according to the invention and, in the enlarged part, the representation of a layer of the gain region, with an injection barrier, an active region and a relaxation region.

FIG. 1 shows, schematically and by way of example, a section through a quantum cascade laser according to the invention, of unipolar type and in which the electrons are the charge carriers.

In this figure, the relative scales cannot be complied with, because of the particularly small thicknesses of some layers. The laser comprises a single crystal indium phosphide (InP) substrate 10, taking the place of the electrode. A waveguide consisting of a first optical confinement layer 12, a gain region 14 having a stratified structure, a second optical confinement layer 16, and an electrode 18 is placed on this substrate 10. The substrate 10 is fastened to a support not shown in the drawing. A wire 19 is fastened to the electrode 18, generally by soldering. The laser is powered by applying a voltage between the support and the wire 19.

The optical confinement layers 12 and 16 are formed from an alloy of indium and gallium arsenide (InGaAs), with a ratio of 52% indium arsenide to 48% gallium arsenide. Such a composition makes it possible to define a crystal structure having the same lattice parameter and identical to that of InP.

Thus, as can be seen in the enlarged part of FIG. 1, the gain region 14 consists of successive layers 20, themselves formed from strata 22 of a first type and from strata 24 of a second type, placed alternately. Each layer 20 has three distinct regions, that is an injection barrier 26, an active region 28 and an injection and relaxation region 30.

Each one of the strata 22, which forms a quantum barrier, mainly consists of an AlInAs alloy, with a ratio of 53 mols % indium arsenide 47 mol % aluminum arsenide. Such a composition generates a crystal structure identical to that of InP.

Each one of the strata 24, which forms a quantum well, mainly consists of an InGaAs alloy having the same composition as the optical confinement layers 12 and 16.

A laser according to the invention has been produced according to the structure mentioned in table 1 below.

TABLE 1

| Reference | Material | Dopant | Doping level [cm$^{-3}$] | Thickness [nm] |
|---|---|---|---|---|
| Substrate 10 | InP | Si | 1–5 × 10$^{17}$ | Very thick |
| Optical confinement layer 12 | Ga$_{0.5x}$Al$_{0.5(1-x)}$InAS | | 2 × 10$^{17}$ | 25 |
| | InGaAs | | 6 × 10$^{16}$ | 200 |
| | Ga$_{0.5x}$Al$_{0.5(1-x)}$InAs | | 3 × 10$^{17}$ | 12.4 |
| Gain region 14 | 35 times the structure of table 2 | | | 1816.5 |
| Optical confinement layer 16 | InGaAs | | 6 × 10$^{16}$ | 200 |
| | Ga$_{0.5x}$Al$_{0S(1-x)}$InAs | | 2 × 10$^{17}$ | 30 |
| Electrode 18 | InP | | 1 × 10$^{17}$ | 2500 |
| | InP | | 7 × 10$^{18}$ | 850 |
| | InP | | 1 × 10$^{20}$ | 10 |

Examples of the properties of the optical confinement layers 12 and 16 and of the electrode 18 are fully given in the patent applications filed under numbers PCT/CH 99/00572 and PCT/CH 00/00159 in the name of the applicant. It is for this reason that their structures will not be specified in a more detailed manner.

Table 2 gives the composition of the strata forming an injection barrier 26 and a layer 20 of the gain region 14, of which there are thirty-five.

TABLE 2

| Reference | Material | Dopant | Doping level [cm$^{-3}$] | Thickness [nm] |
|---|---|---|---|---|
| Injection barrier 26 | AlInAs | | | 4.0 |
| Active region 28 | InGaAs | | | 1.9 |
| | AlInAs | | | 0.7 |
| | InGaAs | | | 5.8 |
| | AlInAs | | | 0.9 |
| | InGaAs | | | 5.7 |
| | AlInAs | | | 0.9 |
| | InGaAs | | | 5.0 |
| | AlInAs | | | 2.2 |
| Relaxation and injection region 30 | InGaAs | | | 3.4 |
| | AlInAs | | | 1.4 |
| | InGaAs | | | 3.3 |
| | AlInAs | | | 1.3 |
| | InGaAs | Si | 3.10$^{17}$ | 3.2 |
| | AlInAs | Si | 3.10$^{17}$ | 1.5 |
| | InGaAs | Si | 3.10$^{17}$ | 3.1 |
| | AlInAs | Si | 3.10$^{17}$ | 1.9 |
| | InGaAs | | | 3.0 |
| | AlInAs | | | 2.3 |
| | InGaAs | | | 2.9 |
| | AlInAs | | | 2.5 |
| | InGaAs | | | 2.9 |

The barrier 26 is therefore formed from a single stratum, of the first type, the active region 28 of four strata of each type, and the relaxation and injection region 30 of six strata of the first type and seven of the second type.

Figure 2A:
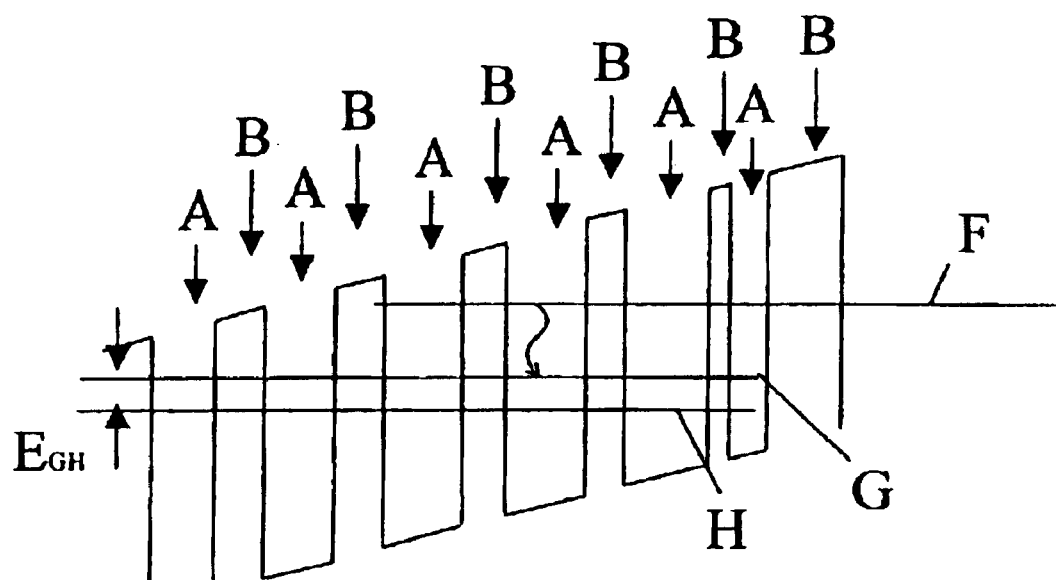
FIG. 2 shows the variation in potential inside the active region and the subbands between which the electrons pass.
Figure 2B:
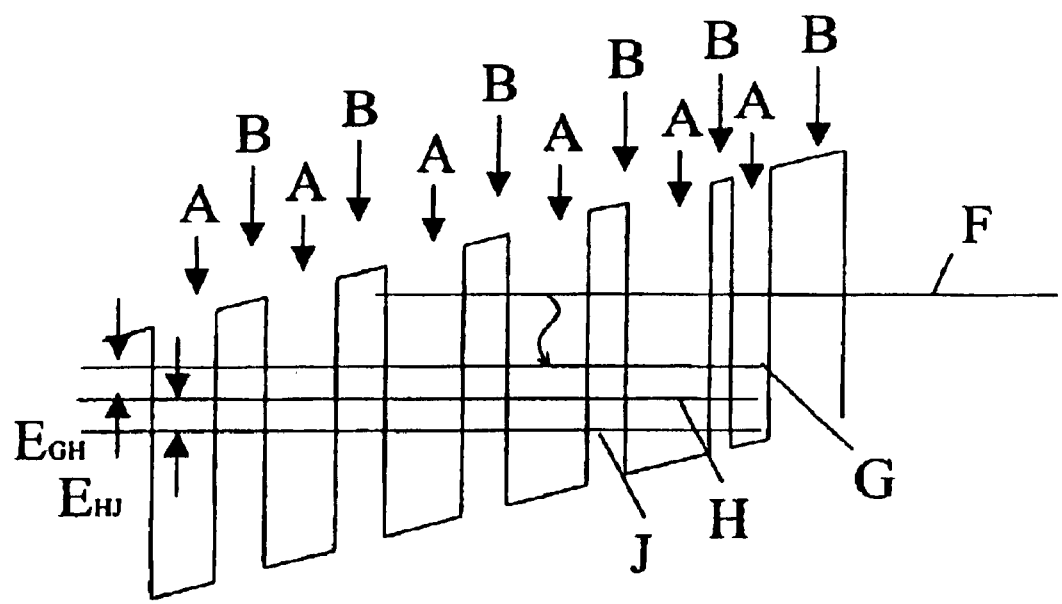

In this laser, the potential inside the active region, in the presence of an electric excitation field, varies as shown in FIG. 2. This potential has a crenelated structure, with hollows A corresponding to the strata of the first type, the crenelations B separating them corresponding to the barriers.

In known lasers, known especially from patent U.S. Pat. No. 5,457,709 mentioned above, electrons are extracted by resonance with an optical phonon. In these lasers and as shown in diagram a of FIG. 4, the electrons can occupy several subbands in each well, that is an upper subband F, a middle subband G and a lower subband H.

The upper subband F corresponds to the injection potential of the electrons. The active electrons start from this subband. These electrons generate laser radiation on passing into the middle subband G. In order for emission to take place, it is necessary for the population of the upper subband F to be greater than that of the population of the middle subband G, which can be obtained by resonance with an optical phonon. This resonance may be obtained provided that the potential difference between the middle subband G and the lower subband H corresponds, on transition of an electron, to an energy loss $E_{GH}$ which is substantially equal to the energy of the optical phonons emitted by the single crystal in question, equal to 34 meV in a single crystal consisting of the materials mentioned in tables 1 and 2.

The result may be much greater on using resonance with two phonons, for example with a configuration as shown in diagram b of FIG. 2. In this configuration, the electrons may in addition occupy a fourth subband J, called second lower subband, the potential difference between the first and second lower subbands H and J corresponding, on transition of an electron, to an energy loss $E_{HJ}$ which is substantially equal to $E_{GH}$ and consequently, to the energy of the optical phonons emitted.

Three types of transitions with emission of optical phonons are possible, that is:
- a transition from the subband G to the subband H, with emission of an optical phonon;
- a transition from the subband H to the subband J, with emission of an optical phonon;
- a transition from the subband G to the subband J, with emission of two optical phonons.

Figure 3:
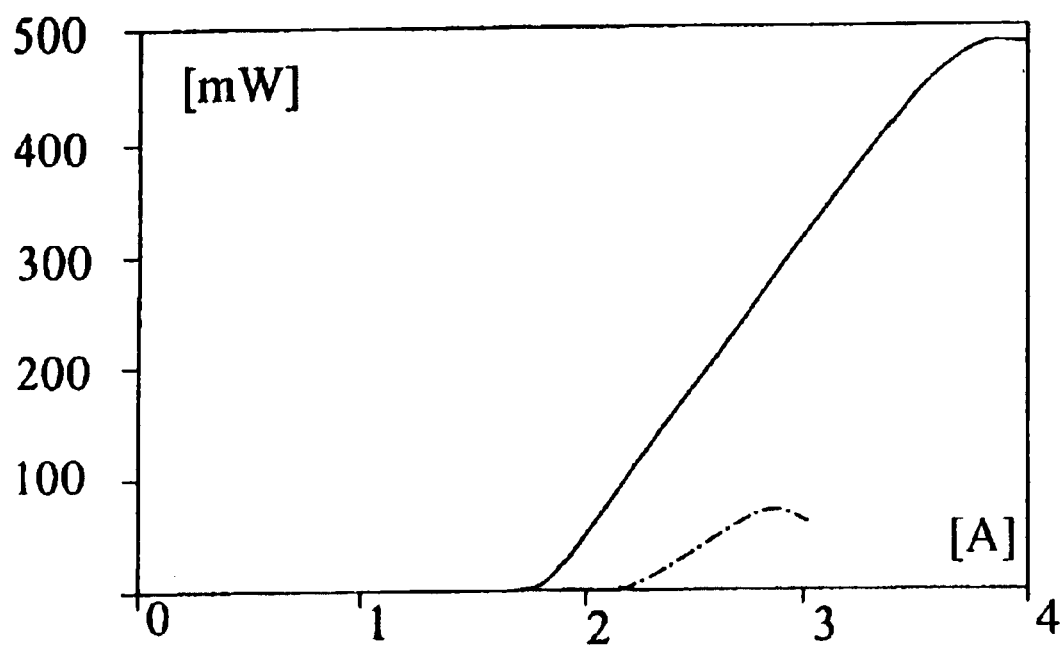
FIG. 3 gives, in the form of curves, physical properties obtained by means of a laser according to the invention.

All these transitions make it possible to substantially reduce the population of the subband G, which reinforces the population inversion and consequently improves the laser operation. This improvement is illustrated in FIG. 3, which represents two curves showing how the power supplied [mW] varies as a function of the current [A], in solid line for the laser according to the invention and in mixed line for the laser corresponding to the embodiment described in Appl. Phys. Letters, volume 75, number 11 of Sep. 13, 1999 in a publication entitled "Electrically tunable, room-temperature quantum-cascade lasers" (A. Muller et al.). The two lasers compared have the same size, are measured at the same temperature of 30° C. and emit at neighboring wavelengths. The table below makes it possible to compare the results obtained.

TABLE 3

|  | Prior art | Invention |
| --- | --- | --- |
| Threshold current [A] | 2.2 | 1.8 |
| Maximum power supplied [mW] | 80 | 440 |

On reading the table of FIG. 3, it appears that the laser according to the invention has a markedly greater efficiency and may, furthermore, supply a much greater power with the same dimensions.

Figure 4:
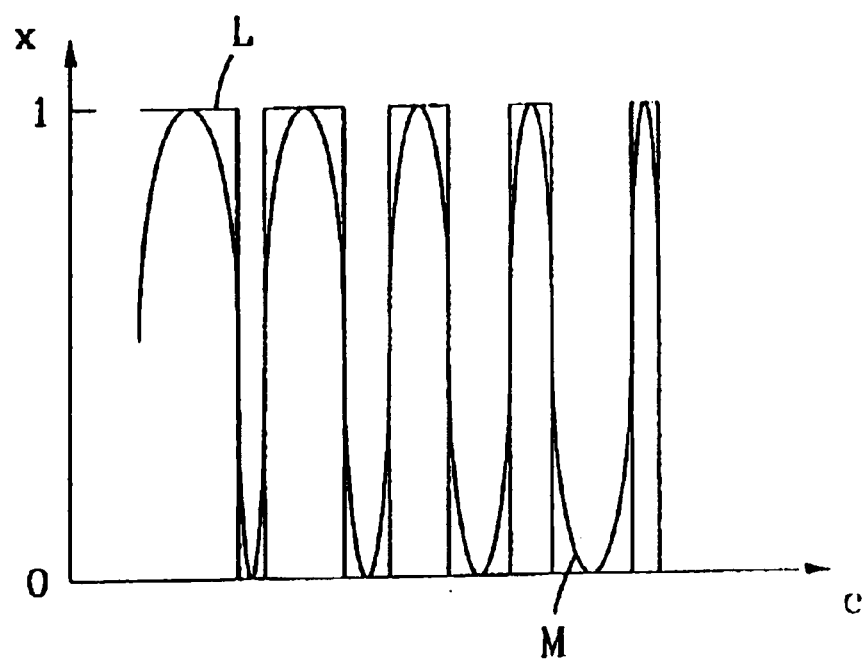
FIG. 4 shows the variation in the chemical composition of the strata in a layer of the active region.

The laser according to the invention may be improved by altering the chemical composition of the strata in the gain region, as shown in FIG. 4. In this figure, it is assumed that the chemical composition has the formula $Ga_xAl_{(1-x)}InAs$, in which x varies from 0 to 1, depending on the position in question within the thickness of the layer. The x-axis relates to the thickness e of the structure and the y-axis to x. The curve L shows the variation in composition as exhibited in the lasers according to the prior art and in the example given above, while the curve M relates to a particular embodiment.

To produce a structure having a composition corresponding to the curve L, the materials (InGaAs and AlInAs) are deposited in succession. By proceeding in this way, the wells and the barriers form almost vertical sides, the diffusion between strata being low. It has been noticed that, at the interfaces of the strata, the electrons tend to diffuse, as explained by K. L. Campman et al., in his article mentioned above.

One composition of the layer corresponding to the curve M makes it possible to alleviate this drawback. This curve has a shape with maxima in the middle parts of the strata, the composition varying continuously between two middle parts.

It is especially possible to produce a layer such as the one shown by the curve M by alternating the InGaAs and AlInAs depositions more frequently, the thickness of each deposition representing a stratum portion, corresponding to a few atomic layers.

In some applications, it is necessary to have a narrow light emission spectrum. This condition can be satisfied with an upper confinement layer, that is to say placed on the side opposite the substrate, which has a structure defining a diffraction grating having a pitch equal to a multiple of the wavelength, in the single crystal, of the desired emission spectrum. The production of such a grating forms the subject matter of the patent application filed under number PCT/CH 00/0159, under the title "Laser semi-conducteur infrarouge" [Infrared semiconductor laser], in the name of the applicant.

The quantum cascade laser according to the invention may be subject to many variants, without however departing from the scope of the invention. Materials other than AlInAs may form barriers, for example InP or AlGaAs. The number of strata and their thicknesses may also vary considerably.

What is claimed is:

1. A quantum cascade laser comprising two electrodes (10, 18), for applying an electric control field, and a waveguide placed between the two electrodes and which comprises:

a gain region (14) consisting of several layers (20) which each comprise alternating strata (22) of a first type each defining a quantum barrier and strata (24) of a second type each defining a quantum well, these strata consisting of first and second semiconductor materials, respectively forming barriers and wells, and two optical confinement layers (12, 16)

placed on each side of the gain region (14), characterized in that each layer (20) of the gain region (14) has an injection barrier (26) and an active region (28) formed from at least three pairs of strata, each pair consisting of a stratum of the first (22) type and a stratum of the second (24) type, and in that the strata of the active region of each layer are arranged so that each of the wells has at least a first upper subband (F), a second middle subband (G), and third (H) and fourth (J) lower subbands, the potential differences between the second and third subbands, on the one hand, and the third and fourth subbands, on the other hand, being such that the transition of an electron from the second to the third subband, or the third to the fourth, emits an energy ($E_{GH}$, $E_{HJ}$) corresponding to that needed for the emission of an optical phonon.

2. The laser claimed in claim 1, characterized in that said region (28) comprises at least four strata of the second type.

3. The laser as claimed in claim 1, characterized in that the strata of the first (22) and of the second (24) type respectively have concentrations of 100% of the first and of the second materials in their middle parts, while between two middle parts, the strata consist of an alloy of said two materials, the concentrations of which vary continuously.

4. The laser as claimed in claim 1, characterized in that it further comprises a substrate (10), on which said layers (20) are placed.

5. The laser as claimed in claim 4, characterized in that said substrate (10) is made of indium phosphide InP.

6. The laser as claimed in claim 5, characterized in that the second material is InGaAs and the first is chosen from AlGaAs, InP and AlInAs.

7. The laser as claimed in claim 4, characterized in that said first and second materials are chosen such that they have lattice parameters one of which is greater, the other of which is smaller than those of said substrate.

8. The laser as claimed in claim 4, characterized in that the confinement layer (16) opposite said substrate (10) has a structure defining a diffraction grating having a pitch equal to a multiple of a half wavelength in the crystal with the desired emission spectrum.

9. The laser as claimed in claim 2, characterized in that the strata of the first (22) and of the second (24) type respectively have concentrations of 100% of the first and of the second materials in their middle parts, while between two middle parts, the strata consist of an alloy of said two materials, the concentrations of which vary continuously.

10. The laser as claimed in claim 2, characterized in that it further comprises a substrate (10), on which said layers (20) are placed.

11. The laser as claimed in claim 3, characterized in that it further comprises a substrate (10), on which said layers (20) are placed.

12. The laser as claimed in claim 9, characterized in that it further comprises a substrate (10), on which said layers (20) are placed.

13. The laser as claimed in claim 10, characterized in that said substrate (10) is made of indium phosphide InP.

14. The laser as claimed in claim 11, characterized in that said substrate (10) is made of indium phosphide InP.

15. The laser as claimed in claim 13, characterized in that the second material is InGaAs and the first is chosen from AlGaAs, InP and AlInAs.

16. The laser as claimed in claim 14, characterized in that the second material is InGaAs and the first is chosen from AlGaAs, InP and AlInAs.

17. The laser as claimed in claim 5, characterized in that said first and second materials are chosen such that they have lattice parameters one of which is greater, the other of which is smaller than those of said substrate.

18. The laser as claimed in claim 6, characterized in that said first and second materials are chosen such that they have lattice parameters one of which is greater, the other of which is smaller than those of said substrate.

19. The laser as claimed in claim 5, characterized in that the confinement layer (16) opposite said substrate (10) has a structure defining a diffraction grating having a pitch equal to a multiple of a half wavelength in the crystal with the desired emission spectrum.

20. The laser as claimed in claim 6, characterized in that the confinement layer (16) opposite said substrate (10) has a structure defining a diffraction grating having a pitch equal to a multiple of a half wavelength in the crystal with the desired emission spectrum.

21. The laser as claimed in claim 7, characterized in that the confinement layer (16) opposite said substrate (10) has a structure defining a diffraction grating having a pitch equal to a multiple of a half wavelength in the crystal with the desired emission spectrum.

* * * * *